United States Patent
Schoenfeld et al.

(10) Patent No.: US 6,556,399 B1
(45) Date of Patent: Apr. 29, 2003

(54) DEVICE AND METHOD FOR ELECTROSTATIC DISCHARGE PROTECTION OF A CIRCUIT DEVICE

(75) Inventors: Aaron M. Schoenfeld, Boise, ID (US); Alan J. Wilson, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/556,172

(22) Filed: Apr. 20, 2000

Related U.S. Application Data

(63) Continuation of application No. 09/209,210, filed on Dec. 10, 1998, now Pat. No. 6,181,540, which is a continuation of application No. 08/802,665, filed on Feb. 19, 1997, now Pat. No. 5,889,644.

(51) Int. Cl.[7] .................................................. H02H 9/00
(52) U.S. Cl. ........................................................ 361/56
(58) Field of Search ............................ 361/56, 111, 58, 361/91.1, 119; 257/355–358

(56) References Cited

U.S. PATENT DOCUMENTS

| | | | |
|---|---|---|---|
| 5,293,057 A | 3/1994 | Ho et al. ..................... | 257/356 |
| 5,315,255 A | 5/1994 | Bettinger ..................... | 324/457 |
| 5,654,862 A | 8/1997 | Worley et al. ............... | 361/111 |
| 5,721,658 A | 2/1998 | Ma et al. ..................... | 361/111 |
| 5,751,507 A * | 5/1998 | Watt et al. ................... | 361/111 |
| 5,889,644 A | 3/1999 | Schoenfeld et al. .......... | 361/56 |
| 5,982,599 A | 11/1999 | Ma et al. ..................... | 361/111 |
| 6,181,540 B1 | 1/2001 | Schoenfeld et al. .......... | 361/56 |

* cited by examiner

*Primary Examiner*—Ronald W. Leja
(74) *Attorney, Agent, or Firm*—Dorsey & Whitney LLP

(57) ABSTRACT

An circuit device includes a stack of electrostatic discharge protection devices shared between a plurality of contact pads on the device. In addition, each contact pad is coupled to its own individual protection device. Together, the individual protection devices and the stack establish a trip point for shunting a charge from the contact pads in the event that any of the pads reach a voltage potential greater then the trip point. In doing so, the stack protects internal operations circuits from damage. At the same time, the shared stack conserves die space.

5 Claims, 4 Drawing Sheets

DEVICE AND METHOD FOR ELECTROSTATIC DISCHARGE PROTECTION OF A CIRCUIT DEVICE

RELATED APPLICATION

This application is a continuation of application Ser. No. 09/209,210, filed on Dec. 10, 1998 now U.S. Pat. No. 6,181,540; which is a continuation of application Ser. No. 08/802,665, filed Feb. 19, 1997 and issued as U.S. Pat. No. 5,889,644.

FIELD OF THE INVENTION

The present invention relates generally to electrostatic discharge protection arrangements for circuit devices and, more specifically, to a system and method for diverting the transmission of electrostatic discharges.

BACKGROUND OF THE INVENTION

It is well known to those skilled in the art that, during handling and testing of circuit devices, electrostatic charges can be applied to the contact pads of such a device. These charges may be subsequently discharged through the device, thereby causing damage. One solution known in the prior art for preventing damage from these electrostatic discharge (ESD) events is to connect protection devices, such as p-n junction diodes, between each contact pad and its corresponding operations circuit. Typically, one such diode leads to a voltage source $V_{CC}$ and another leads to ground. In the event a sufficient charge builds up on a contact pad, one of the two diodes will activate and direct the charge away from the operations circuit. Further, the activation of the diodes will be based on their threshold voltage ($V_t$). For example, a positive charge will be diverted towards the voltage source $V_{CC}$ when the contact pad's potential exceeds one $V_t$ above $V_{CC}$. Alternatively, a negative charge will be diverted toward ground when the contact pad's potential is one $V_t$ below ground.

Occasionally, it is desirable to drive an operations circuit at voltages beyond the one $V_t$ parameters. Those of ordinary ski in the art know that the trip point for shunting charges can be changed by adding diodes to the configuration described above. Nevertheless, based on prior art teachings, changing the trip point for several operations circuits would require adding diodes for each contact pad. Unfortunately, these diodes, as well as other ESD protection devices, require a significant amount of die space. Thus, it would be desirable to provide ESD protection, while at the same time allowing for the alteration of the trip point without the space requirements necessary in the prior art.

SUMMARY OF THE INVENTION

Accordingly, the present invention provides for ESD protection and trip point alteration of a circuit device. Several embodiments of the present invention are designed to accommodate a circuit device having a plurality of terminals, each leading to a different operations circuit. In one preferred embodiment of the present invention, an ESD protection device is connected to each terminal. These ESD protection devices, in turn, are commonly coupled to a stack of additional ESD protection devices. The number of devices in this stack depends upon the particular trip point to be established. Thus, in addition to protecting the device from ESD, the shared stack in this preferred embodiment has the added advantage of reducing the number of ESD protection devices needed to safeguard the operations circuits.

Further, this configuration allows for simultaneous trip point alteration for different operations circuits, once again reducing the number of ESD protection devices needed to do so. The present invention also encompasses various methods for achieving these advantages.

DETAILED DESCRIPTION OF THE PREFERRED EMBODIMENTS

Figure 1:
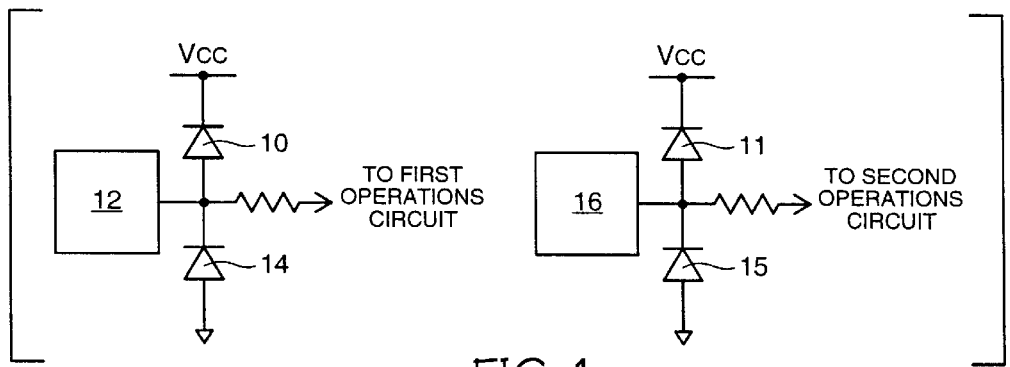
FIG. 1 illustrates an ESD protection circuit as found in the prior art.

A standard ESD protection circuit is illustrated in FIG. 1, wherein a first diode 10 is coupled to the supply voltage $V_{CC}$ and is provided for a first contact pad 12. The first contact pad 12, in turn, leads to a first operations circuit of a semiconductor device. For purposes of this application, the term "contact pad" refers to any conductive surface configured to permit temporary or permanent communication with an eternal operations circuit or node. A second diode 14 is coupled between the first contact pad 12 and ground. Similarly configured diodes 11 and 15 can be coupled to a second contact pad 16, which leads to a second operations circuit. In fact, generally every contact pad on the device can be configured in a similar manner. For purposes of clarity, however, only two such pads are illustrated in FIG. 1. Should a sufficient charge build up on the first contact pad 12, one of the two diodes 10 or 14 will turn on and shunt the charge away from the operations circuit. As discussed in the background section, this configuration allows an operations circuit to accommodate voltages ranging from one $V_t$ greater than the supply voltage $V_{CC}$ to one $V_t$ less than ground before a charge is diverted. As an example of the operation of this prior art configuration, the first diode 10 will turn on should contact pad 12 have a charge with a voltage potential that is one $V_t$ greater than $V_{CC}$. At that point, the first diode 10 turns on, thereby creating a path of lesser electrical resistance than the path leading to the operations circuit. As a result, the first diode 10 shunts the charge through itself and to the voltage source. Similarly, the second diode 14 has a trip point of one $V_t$ less than ground. When the voltage potential of a charge at the first contact pad 12 reaches that point, the second diode 14 turns on and draws the current through itself toward ground. Charges at the second contact pad 16 are handled in the same manner.

Figure 2:
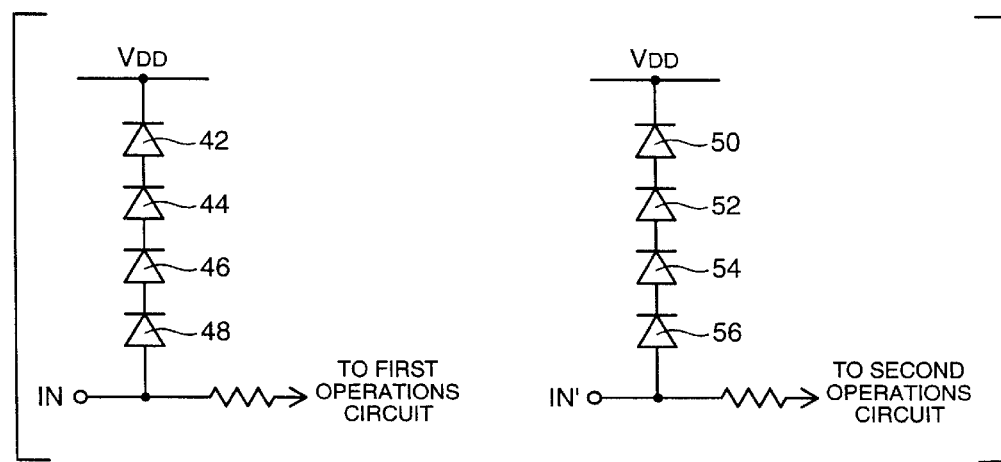
FIG. 2 demonstrates a prior art example of an ESD protection circuit using multiple diodes to alter the trip point at which current is diverted.

FIG. 2 highlights a prior art configuration in which the trip point of the ESD protection circuits is increased. Four diodes 42, 44, 46, and 48 are coupled between an input contact point IN and the source voltage which, in this case, is labeled $V_{DD}$. As a result, a charge at IN will not be diverted until the voltage potential reaches four $V_t$'s above $V_{DD}$. It is noteworthy that this multiple diode protection circuit is repeated for a second operations circuit, wherein four diodes 50, 52, 54, and 56 are electrically interposed between an input contact point IN' and $V_{DD}$. Further, the same configuration is used for every input terminal in this prior art example. Thus, this example teaches that changing the trip point for multiple operations circuits requires adding diodes for each contact point.

Figure 3:
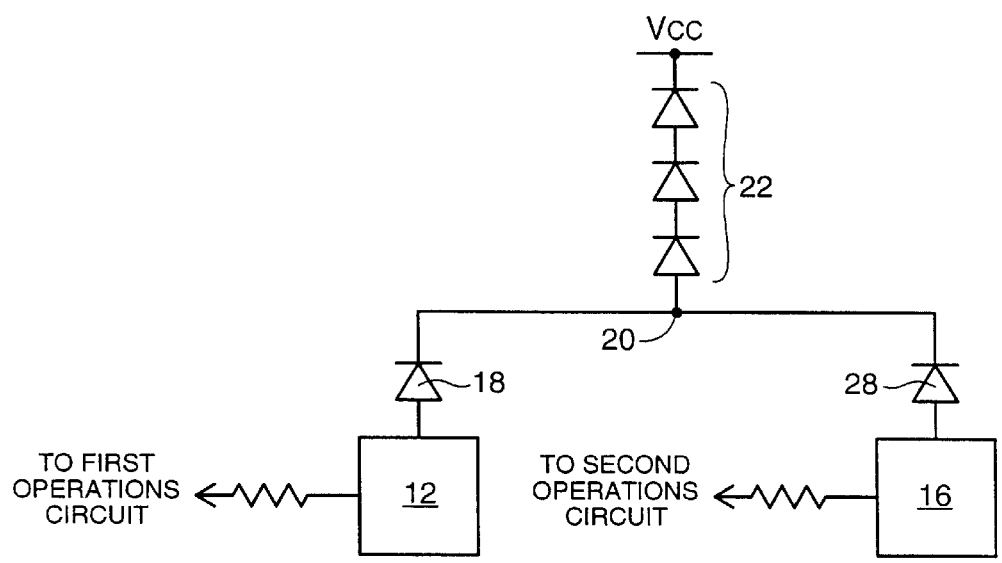
FIG. 3 demonstrates one exemplary embodiment of an ESD protection device in accordance with the present invention.

A preferred embodiment of the invention using fewer gates to achieve the same effect appears in FIG. 3. A first contact pad 12 and a second contact pad 16 are again shown, although it is understood that a pad plurality of any size will benefit from this invention. The first contact pad 12 is coupled to an exclusive diode 18 that is configured to protect only the first contact pad 12. Similarly, the second contact pad 16 is also coupled to an exclusive diode 28. Exclusive diodes 18 and 28 share a first common node 20. A positive ESD diode stack 22 is coupled to the first common node 20 and is further configured to receive a voltage source, $V_{CC}$, although the voltage source itself is not a part of the invention. In FIG. 3, the positive ESD diode stack 22 comprises three diodes. It is understood, however, that the positive ESD diode stack 22 could contain any number of diodes coupled in series, cathode-to-anode, so that current is conducted predominantly in only one direction through the stack. Moreover, the diode stack as generally used in this and other embodiments may comprise only one diode. Given the stack size in FIG. 3 combined with the exclusive diode 18, a charge on the first contact pad 12 reaching a voltage potential of four $V_t$'s above $V_{CC}$ will be drawn away from the first operations circuit towards the voltage source. Moreover, the orientation of the exclusive diode 28 isolates the second contact pad 16 from a positive ESD event transmitted through the first contact pad 12. Conversely, exclusive diode 18 will isolate the first contact pad 12 from any ESD at the second contact pad 16. As a result, this embodiment has established a trip point of four $V_t$'s above $V_{CC}$ for protecting both contact pads 12 and 16 using only five diodes, whereas prior art systems require eight diodes—four for each contact pad.

Figure 4:
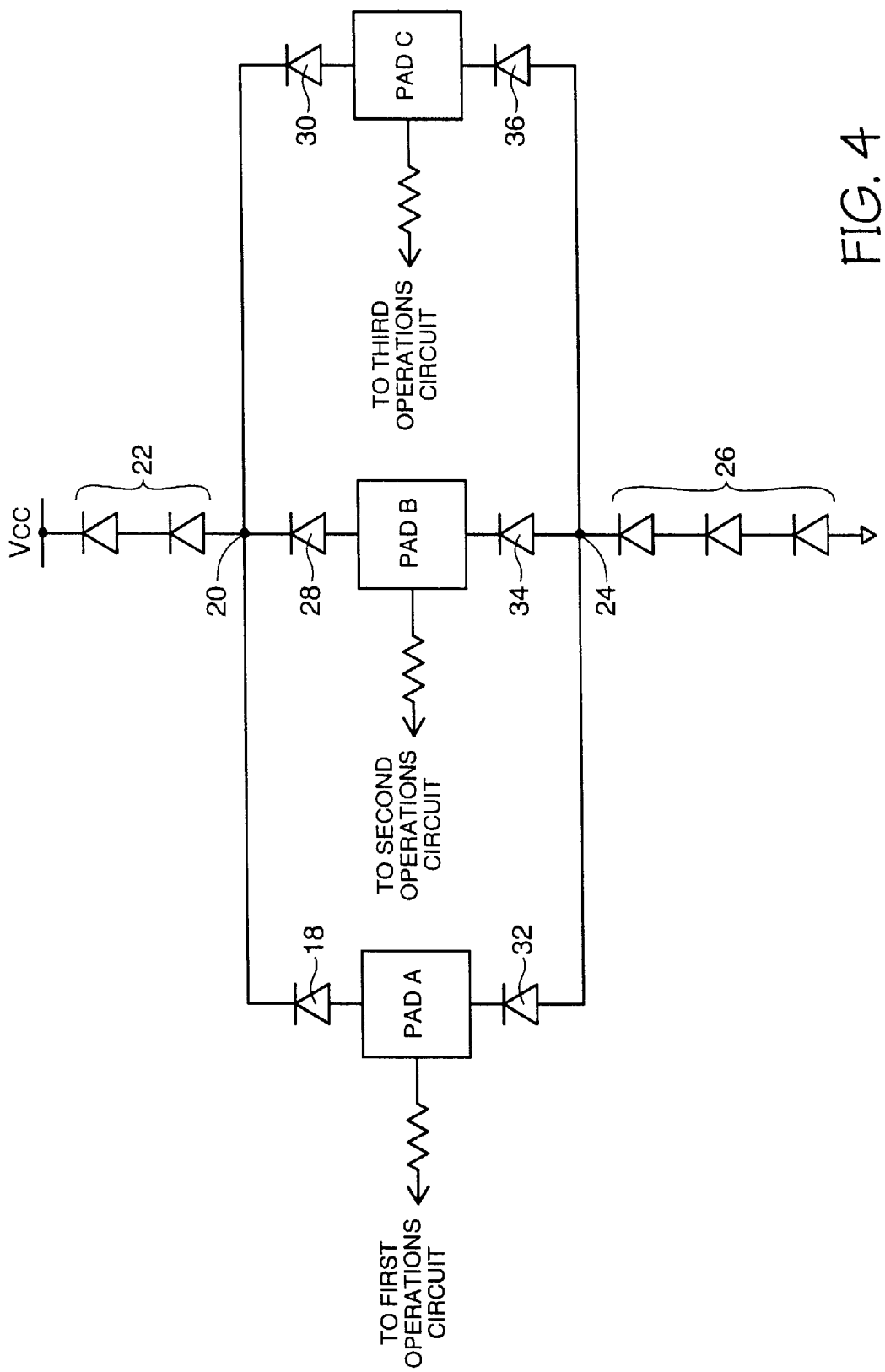
FIG. 4 demonstrates a second exemplary embodiment in accordance with the present invention.

FIG. 4 shows another exemplary embodiment in which three contact pads A, B, and C, each coupled to a separate operations circuit, are protected from a positive ESD event by three exclusive diodes 18, 28, and 30, as well as a positive ESD diode stack 22 comprising two diodes. This second embodiment also illustrates that a shared stack of diodes can be used to protect against negative ESD events as well. Three exclusive diodes 32, 34, and 36 are provided, one at each contact pad, and share a second common node 24. A negative ESD diode stack 26 is coupled to the second common node 24 and is configured to connect to ground, although ground is not claimed as part of the current invention. As with the positive ESD diode stack 22, the negative ESD diode stack 26 may comprise one or more diodes. In FIG. 4 the negative ESD diode stack 26 comprises a series of three diodes, thereby demonstrating that the size of the negative ESD diode stack 26 may differ in size from the positive ESD diode stack 22. The negative ESD diode stack 26 and the exclusive diodes 32, 34, and 36 coupled to it are configured to draw an electric charge from any of the contact pads having a negative voltage potential exceeding four $V_t$'s below ground. In addition, the orientation of the three exclusive diodes 32, 34, and 36 serve to isolate each contact pad from negative ESD events originating at the other pads. Thus, the operations circuits in FIG. 4 are protected from a negative ESD event that might be transmitted through the pads shown. For such an event, this exemplary embodiment also establishes a trip point of four $V_t$'s below ground using only 6 diodes, whereas the prior art would require 12 diodes.

Figure 5:
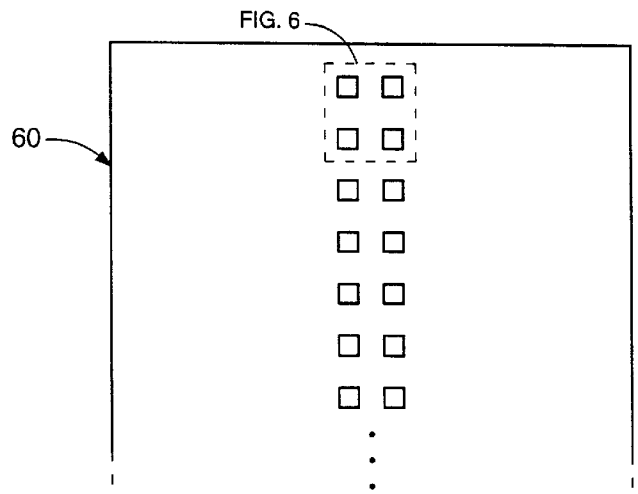
FIG. 5 depicts a contact pad configuration found on a particular device in the prior art.
Figure 6:
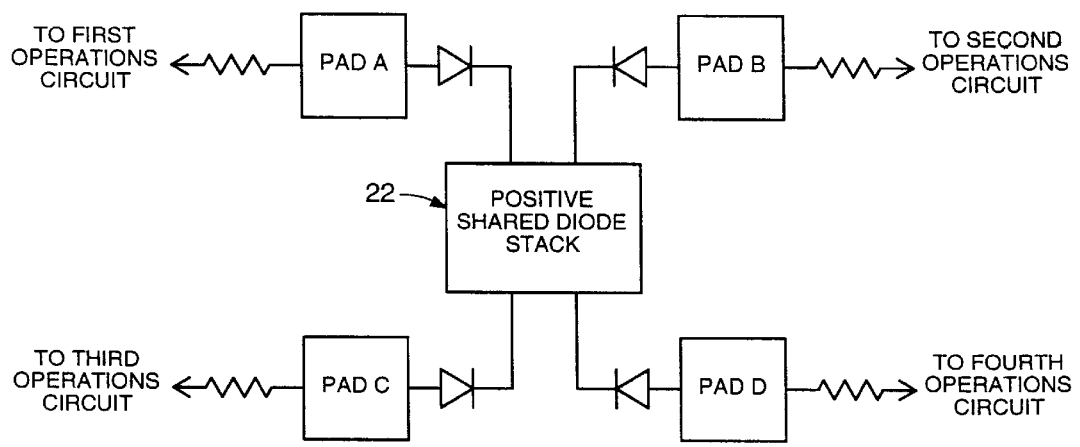
FIG. 6 is a close-up, top-down view of the device in FIG. 5 and demonstrates a third exemplary embodiment in accordance with the present invention.

From the exemplary embodiments in FIGS. 3 and 4, it follows that more space on the circuit device is saved as the number of pads sharing diode stacks increases. The invention would be particularly useful given the contact pad configurations of certain circuit devices in current use. FIG. 5 illustrates such a device, wherein the contact pads are located in the center of a die 60 and extend in two columns down its length. The close-up view in FIG. 6 demonstrates how four contact pads on this device may be wired to share a positive ESD diode stack 22. Given the proximity of each contact pad to the others in this device, even more contact pads may share the positive ESD diode stack 22 for a greater saving of space. Further, the contact pads could also share a negative ESD diode stack.

One of ordinary skill in the art can appreciate that, although specific embodiments of this invention have been described above for purposes of illustration, various modifications may be made without departing from the spirit and scope of the invention. For example, protection devices other than p-n junction diodes may be used to shunt current away from the operations circuits, such as metal-oxide semiconductor field effect transistor (MOSFEST) diodes and bipolar junction transistors (BJT's). In addition, it should be noted that the contact pads discussed above could serve as either input pads or output pads. Accordingly, the invention is not limited except as stated in the claims.

What is claimed is:

1. A semiconductor device having a plurality of contact points, comprising:
   a current diverting apparatus, further comprising:
      a first ESD event circuit comprising:
         a first plurality of ESD protection devices coupled to said plurality of contact points, and
         a first ESD stack coupled to said first plurality of ESD protection devices, the first ESD stack including a first number of additional series-coupled ESD protection devices, the first number being greater than one; and
      a second ESD event circuit comprising:
         a second plurality of ESD protection devices coupled to said plurality of contact points, and
         a second ESD stack coupled to said second plurality of ESD protection devices, the second ESD stack including a second number of additional series-coupled ESD protection devices;
      wherein said first ESD stack is configured to divert current to a positive potential and second ESD stack is configured to divert current to a single non-positive potential.

2. The semiconductor device in claim 1, wherein said first ESD stack is connectable to a voltage source.

3. The semiconductor device in claim 1, wherein said second ESD stack is connectable to ground.

4. The semiconductor device in claim 1, wherein:
   said first number of additional ESD protection devices is different from said second number of additional ESD protection devices.

5. A method of forming a device having a plurality of contact pads that require a plurality of ESD protection devices, comprising:
   coupling a first set of said plurality of ESD protection devices to said plurality of contact pads;
   isolating said first set from a voltage supply pad;
   stacking a second set of said plurality of ESD protection devices;
   isolating said second set from a voltage supply pad; and
   connecting said second set to said first set.

* * * * *